(12) United States Patent
Lin et al.

(10) Patent No.: US 12,557,306 B2
(45) Date of Patent: Feb. 17, 2026

(54) CONVEX SHAPE TRENCH IN RDL FOR STRESS RELAXATION

(71) Applicant: Taiwan Semiconductor Manufacturing Company, Ltd., Hsinchu (TW)

(72) Inventors: Chia-Nan Lin, Chiayi (TW); Yen-Cheng Lin, Taipei (TW); Jiann-Horng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 435 days.

(21) Appl. No.: 18/163,995

(22) Filed: Feb. 3, 2023

(65) Prior Publication Data

US 2024/0213190 A1    Jun. 27, 2024

Related U.S. Application Data

(60) Provisional application No. 63/477,003, filed on Dec. 23, 2022.

(51) Int. Cl.
*H01L 23/498* (2006.01)
*H01L 21/762* (2006.01)
(Continued)

(52) U.S. Cl.
CPC ........ *H01L 24/02* (2013.01); *H01L 21/76227* (2013.01); *H01L 21/76892* (2013.01);
(Continued)

(58) Field of Classification Search
CPC ......... H01L 23/49838; H01L 23/49822; H01L 23/49866; H01L 21/4853; H01L 21/4857;
(Continued)

(56) References Cited

U.S. PATENT DOCUMENTS 10,256,202 B1* 4/2019 Spry .................. H01L 23/5226
11,145,564 B2* 10/2021 Huang ..................... H01L 24/16
(Continued)

FOREIGN PATENT DOCUMENTS

TW    202245061 A    11/2022

*Primary Examiner* — Wael M Fahmy
*Assistant Examiner* — Aneesa Riaz Baig
(74) *Attorney, Agent, or Firm* — Ingrassia Fisher & Lorenz, LLP

(57) ABSTRACT

A method includes: providing a passivation layer with an embedded MIM capacitor; forming a redistribution layer (RDL) above the passivation layer; and forming an opening in the RDL above the MIM capacitor, wherein the opening separates the RDL into first and second RDL structures, wherein each of the first and second RDL structures has a convex-shaped profile on a sidewall that defines the opening that separates the first RDL structure from the second RDL structure, and wherein the convex-shaped profile on the sidewalls resists stress migration from the RDL to the MIM capacitor to resist stress migration induced cracks forming in the MIM capacitor. The forming an opening includes: removing a portion of the RDL to a first depth using first etching operations; and removing a portion of the RDL to a second depth by laterally etching sidewalls of the first and second RDL structures.

20 Claims, 14 Drawing Sheets

(51) Int. Cl.
*H01L 21/768* (2006.01)
*H01L 23/00* (2006.01)
*H10D 1/68* (2025.01)

(52) U.S. Cl.
CPC .............. *H01L 24/05* (2013.01); *H01L 24/13* (2013.01); *H10D 1/692* (2025.01); *H01L 2224/02313* (2013.01); *H01L 2224/0235* (2013.01); *H01L 2224/0239* (2013.01); *H01L 2224/0401* (2013.01); *H01L 2224/05558* (2013.01); *H01L 2224/05569* (2013.01); *H01L 2224/05647* (2013.01); *H01L 2224/05666* (2013.01); *H01L 2224/13082* (2013.01); *H01L 2224/13147* (2013.01); *H01L 2924/01013* (2013.01); *H01L 2924/01029* (2013.01); *H01L 2924/0132* (2013.01)

(58) Field of Classification Search
CPC ............. H01L 21/486; H01L 2224/023; H01L 2224/0231; H01L 2224/02379; H01L 2224/02381; H01L 2224/0239; H01L 2224/024; H01L 2224/0235–0237; H01L 21/76892; H01L 21/76894

See application file for complete search history.

(56) References Cited

U.S. PATENT DOCUMENTS

| | | |
|---|---|---|
| 12,199,054 B2 | 1/2025 | Wu et al. |
| 2012/0098121 A1* | 4/2012 | Chen ................ H01L 21/76877 257/E21.294 |
| 2017/0352631 A1* | 12/2017 | Chuang .................... H01L 24/13 |
| 2020/0051934 A1* | 2/2020 | Lin .......................... H01L 24/02 |
| 2021/0050317 A1* | 2/2021 | Southworth ............ H01L 24/03 |
| 2023/0068082 A1* | 3/2023 | Lin .................... H01L 23/49822 |

\* cited by examiner

CONVEX SHAPE TRENCH IN RDL FOR STRESS RELAXATION

CROSS-REFERENCE TO RELATED APPLICATIONS

This application claims the benefit of U.S. Application No. 63/477,003, filed Dec. 23, 2022, which is incorporated herein by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
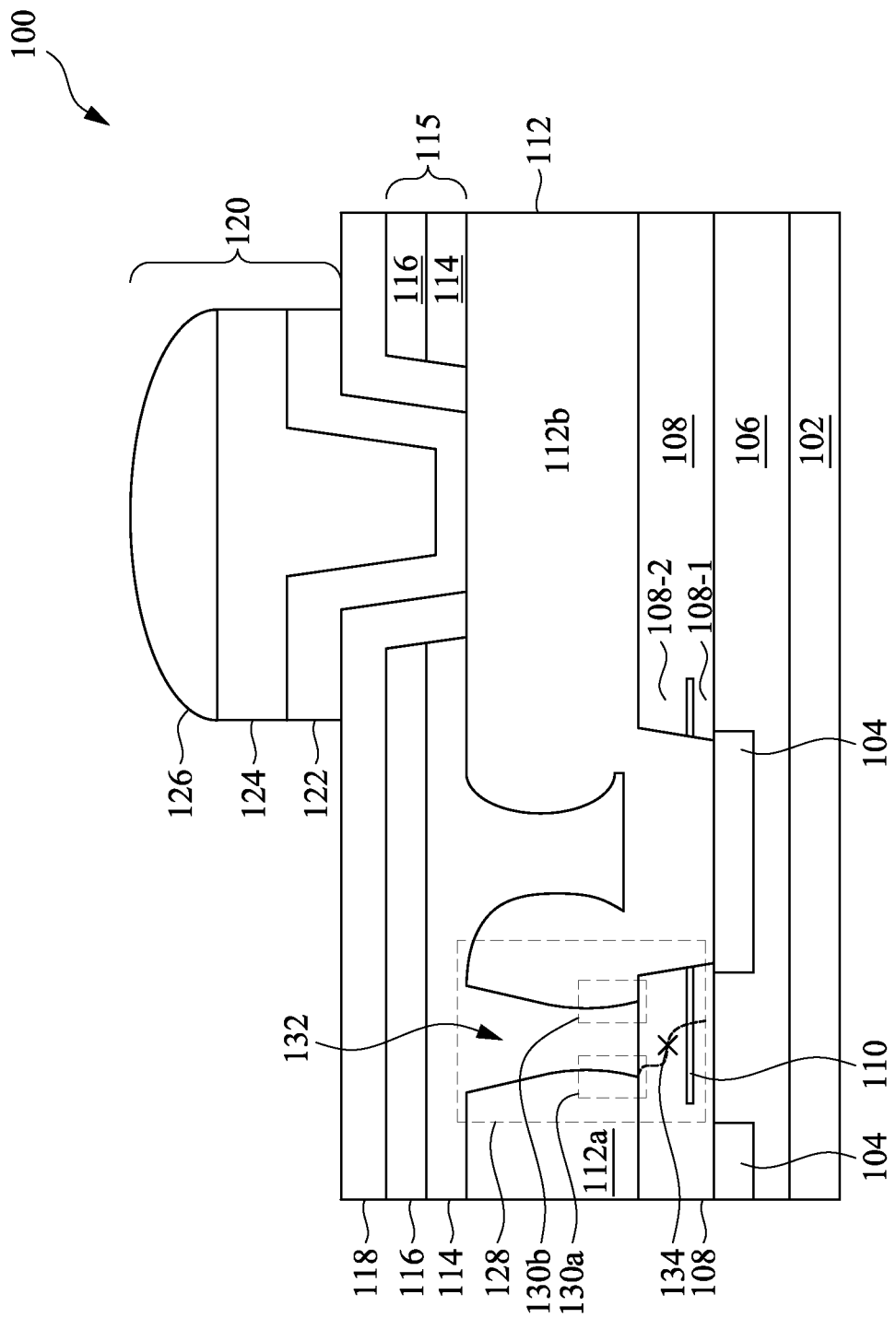
FIG. 1 is a cross-sectional view of a portion of a semiconductor device at one stage in an integrated circuit manufacturing process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer, or section. Thus, a first element, component, region, layer, portion, or section discussed below could be termed a second element, component, region, layer, portion, or section without departing from the teachings of the present disclosure.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

In certain embodiments herein, a "material layer" is a layer that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a layer that is a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of an aluminum layer and a layer of aluminum is a layer that is at least 50 wt. %, at least 60 wt. %, at least 75 wt. %, at least 90 wt. %, at least 95 wt. %, or at least 99 wt. % of aluminum.

Some embodiments of the disclosure will now be described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

Stress migration (SM) is a phenomenon that can occur in an integrated circuit (IC). SM can lead to voids and/or cracks forming within conductors that degrade the performance of an IC. For example, with SM, voids can form as result of vacancy migration and a hydrostatic stress gradient. Voids or cracks in a conductor can lead to open circuits or an increased resistance that impedes the performance of the IC.

When various materials with different thermal expansion coefficients are formed in an interconnect structure, SM can occur due to the formation of stress between different materials. Various thermal processes, such as high pressure annealing, during semiconductor processing can result in the formation of plastic deformation vacancies (e.g., small voids) or cracks in the interconnect structure. These small voids can be driven by stress migration due to the hydrostatic stress gradient to collect at high stress gradient areas in the interconnect structure to nucleate or form into a large void. Large voids can reduce or eliminate electrical contact between metal layers. Thus, SM may cause reduced electrical contact between conductive materials, which causes increased resistivity and can lead to device failure.

SM reliability issues can become more serious as geometries of semiconductor devices continue to shrink. SM effects may be minimized by forming a convex-shaped profile on redistribution layer (RDL) sidewalls in areas where RDL (e.g., AlCu RDL) is separated into multiple RDL structures. Further, embodiments herein may minimize crack formation due to SM on or across Metal-Insulator-Metal (MIM) capacitors positioned near sidewalls of separated RDL due to the profile of the sidewalls. The profile of the sidewalls may further improve film adhesion and provide pad well protection by preventing voids from forming due to SM.

Presented herein are embodiments of semiconductor structures and of methods for forming semiconductor structures with a sidewall profile that reduces the occurrence of problems associated with SM. In certain embodiments, SM is mitigated through the inclusion of a convex-shaped sidewall profile for RDL structures. In exemplary embodiments, the sidewall profile is formed using lateral etching operations FIG. 1 is a cross-sectional view of a portion of an example semiconductor device 100 at one stage in an integrated circuit manufacturing process in accordance with an embodiment. Shown is a portion of a semiconductor device 100 having electrical circuitry formed in and/or upon a substrate 102. The substrate 102 may be one of a variety of types of semiconductor substrates commonly employed in semiconductor integrated circuit fabrication, and integrated circuits may be formed therein and/or thereupon. The semiconductor substrate may be of any construction comprising semiconductor materials, including but not limited to, bulk silicon, a semiconductor wafer, a silicon-on-insulator (SOI) substrate, or a silicon germanium substrate. Other semiconductor materials, including group III, group IV, and/or group V semiconductors, can be used. Although not shown, it will be recognized that the substrate 102 may further comprise a plurality of isolation features, such as shallow trench isolation (STI) features or local oxidation of silicon (LOCOS) features. The isolation features may isolate various microelectronic elements formed in and/or upon the substrate 102. Examples of the types of microelectronic elements that may be formed in the substrate 102 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other suitable elements. Various processes are performed to form the various microelectronic elements, including but not limited to one or more of deposition, etching, implantation, photolithography, annealing, and other suitable processes. The microelectronic elements are interconnected to form the integrated circuit device, which may comprise one or more of a logic device, memory device (e.g., SRAM), radio frequency (RF) device, input/output (I/O) device, system-on-chip (SoC) device, and other suitable types of devices.

The example semiconductor device 100 further includes an interconnection structure overlying the substrate 102. The interconnection structure includes inter-layer dielectric layers and a metallization structure overlying the microelectronic elements. The inter-layer dielectric layers in the metallization structure may include one or more of low-k dielectric materials, un-doped silicate glass (USG), silicon nitride (SiN), silicon oxynitride (SiON), and other commonly used materials. The dielectric constants (k value) of the low-k dielectric materials can be less than about 3.9, or less than about 2.8. Metal lines in the metallization structure may be formed of copper or copper alloys. Top metal pads 104 are formed and patterned in or on a top-level inter-layer dielectric layer 106. The top metal pads 104 provide an electrical connection for external circuitry. The top metal pads 104 can be formed of any suitable conductive materials, including one or more of copper (Cu), tungsten (W), aluminum (Al), AlCu alloys, silver (Ag), or similar materials.

An example first passivation layer 108 is formed and patterned over the conductive pads 104 and top-level inter-layer dielectric layer 106. In various embodiments, the first passivation layer 108 may be formed of a non-organic material, such as un-doped silicate glass (USG), silicon nitride, silicon oxynitride, silicon oxide, or combinations thereof. The first passivation layer 108 may be formed by any suitable method, such as chemical vapor deposition (CVD), physical vapor deposition (PVD), or the like. In other embodiments, the first passivation layer 108 may be formed of a polymer layer, such as an epoxy, polyimide, benzocyclobutene (BCB), polybenzoxazole (PBO), or the like, although other relatively soft, often organic, dielectric materials can also be used. The first passivation layer 108 may include any number of sublayers including a first sublayer 108-1 that overlies a second sublayer 108-2.

The example first passivation layer 108 includes an embedded MIM capacitor 110. The MIM capacitor 110 may be used for various functions, such as a decoupling capacitor, a high-frequency noise filtering capacitor in mixed-signal applications, oscillators, phase-shift networks, bypass filters, a coupling capacitor in radio frequency (RF) applications, or other functions. In various embodiments, the MIM capacitor is formed above the first sublayer 108-1 and below the second sublayer 108-2 of the first passivation layer 108.

The example semiconductor device 100 further includes a redistribution layer (RDL) 112 disposed above the first passivation layer 108 and in an opening in the first passivation layer 108. A portion of the RDL 112 is coupled to a top metal pad 104 to reroute an electrical connection at the top metal pad 104 to a desired location such as a UBM structure, a solder bump, and/or a copper pillar bump, for facilitating external electrical connections. In this example, the RDL 112 reroutes the connection at the top metal pad 104 to a bump structure 120 located at a different position on the chip. The ability to redistribute points can enable higher contact density.

In various embodiments the RDL 112 is formed from aluminum copper (AlCu). In various embodiments, the RDL 112 include multiple layers, for example, a barrier layer, a diffusion layer disposed on the barrier layer and an aluminum copper alloy layer disposed on the diffusion layer. The barrier layer may further include a tantalum film and a tantalum nitride film disposed on the tantalum film. The diffusion layer is a metal oxide. In various embodiments, the diffusion layer includes tantalum, oxygen, aluminum, and nitrogen.

The example RDL 112 includes a first RDL structure 112a and a second RDL structure 112b. The first RDL structure 112a is separated from the second RDL structure 112b through a dielectric-filled opening 132 (e.g., filled with USG+HDP layer 114), wherein the dielectric-filled opening 132 is above a portion of the MIM capacitor 110. Each of the first RDL structure 112a and the second RDL structure 112b has a convex-shaped profile on a sidewall of opening 132 (shown in boxes 130a and 130b) that defines the dielectric-filled opening 132 that separates the first RDL structure 112a from the second RDL structure 112b. The convex-shaped profile on end sections (shown in boxes 130a and 130b) have a shape that resists stress migration from the RDL 112 to the MIM capacitor 110 to resist stress migration induced cracks 134 from forming in or across the MIM capacitor 110.

The example semiconductor device 100 further includes a second passivation layer 115 comprising an undoped silica glass plus high density plasma (USG+HDP) layer 114 and a SiN layer 116 disposed above the USG+HDP layer 114. A third passivation layer 118 is disposed above the SiN layer 116.

The example semiconductor device 100 also includes a bump structure 120 comprising a UBM layer 122, a conductive pillar 124, and a solder layer 126 formed on the third passivation layer 118 and electrically connected to the RDL 112 through an opening in the second passivation layer 115. The example UBM layer 122 is formed over the surfaces of the third passivation layer 118 and an exposed portion of the RDL 112. In various embodiments, the UBM layer 122 includes a diffusion barrier layer or a glue layer, which may comprise titanium (Ti), tantalum (Ta), titanium nitride (TiN), tantalum nitride (TaN), or the like and be formed by PVD or sputtering. In various embodiments, the UBM layer 122 further includes a seed layer formed on the diffusion barrier layer by PVD or sputtering. The seed layer may be formed of copper (Cu) or copper alloys including Al, chromium (Cr), nickel (Ni), tin (Sn), gold (Au), or combinations thereof. In some embodiments, the UBM layer 122 includes a Ti layer and a Cu seed layer.

The example conductive pillar 124 is formed on the UBM layer 122. In various embodiments, the conductive pillar 124 includes a Cu layer. The Cu layer comprises pure elemental copper, copper containing unavoidable impurities, and/or copper alloys containing minor amounts of elements such as Ta, indium (In), SN, zinc (Zn), manganese (Mn), chromium (Cr), titanium (Ti), germanium (Ge), strontium (Sr), platinum (Pt), magnesium (Mg), aluminum (Al) or zirconium (Zr). The conductive pillar 124 may be formed by sputtering, printing, electroplating, electro-less plating, electrochemical deposition (ECD), molecular beam epitaxy (MBE), atomic layer deposition (ALD), and/or commonly used CVD methods. In various embodiments, the Cu layer is formed by electro-chemical plating (ECP).

The example solder layer 126 is formed on the conductive pillar 124. The solder layer 126 can be made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, and other similarly appropriate material by plating methods. In various embodiments, the solder layer 126 is formed with a controlled volume.

In various embodiments, a solder reflow process is performed at a temperature equal to or higher than the solder melting temperature. After the solder reflow process, the solder layer 126 is melted and turned into a reflowed solder layer 126. The thickness and surface shape can be changed after the reflow process. For example, the reflowed solder layer 126 has a spherical surface as shown in FIG. 1

Figure 2:
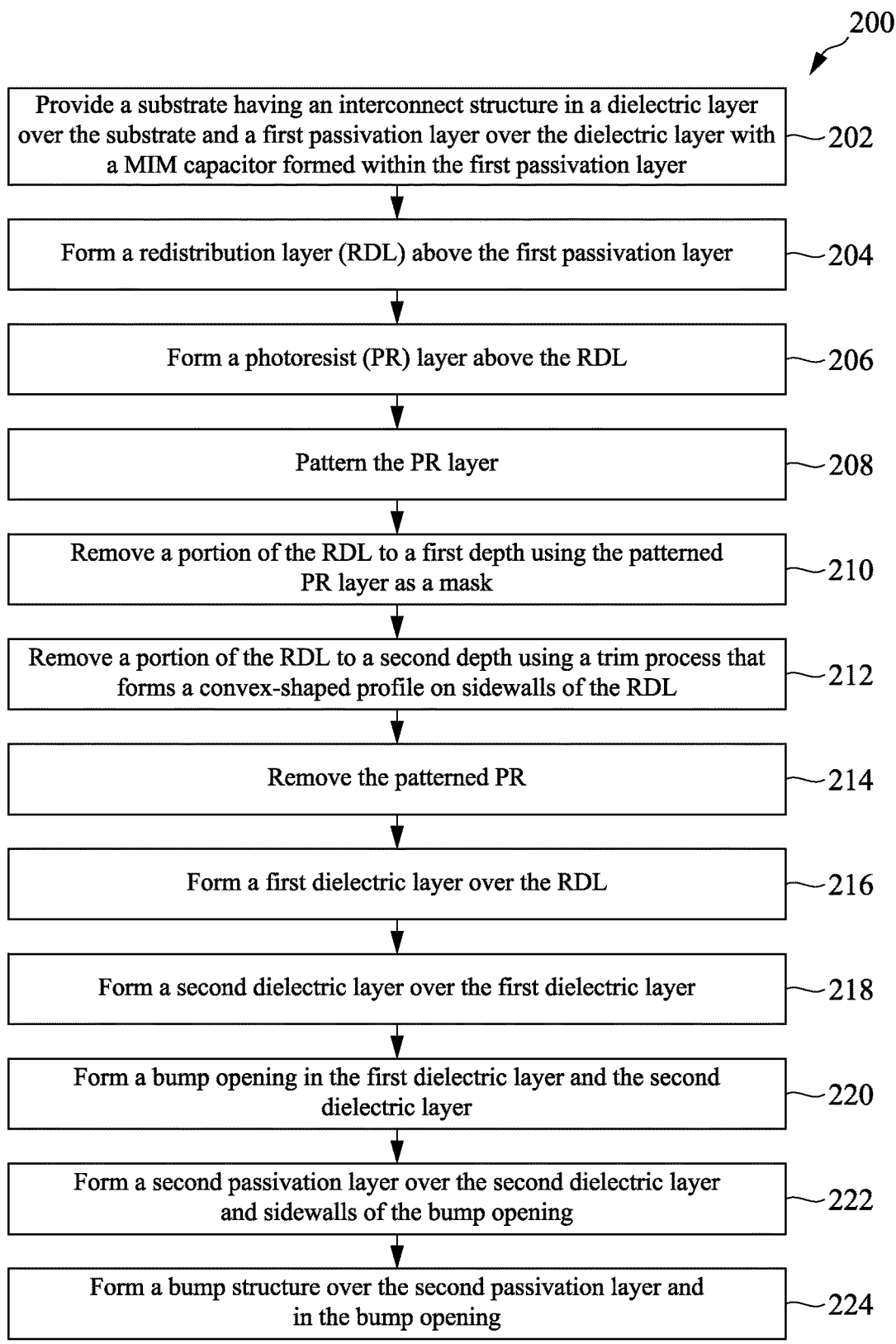
FIG. 2 is a process flow chart depicting an example method of semiconductor fabrication that includes forming a convex-shaped profile on end sections on RDL structures, in accordance with some embodiments.
Figure 3:
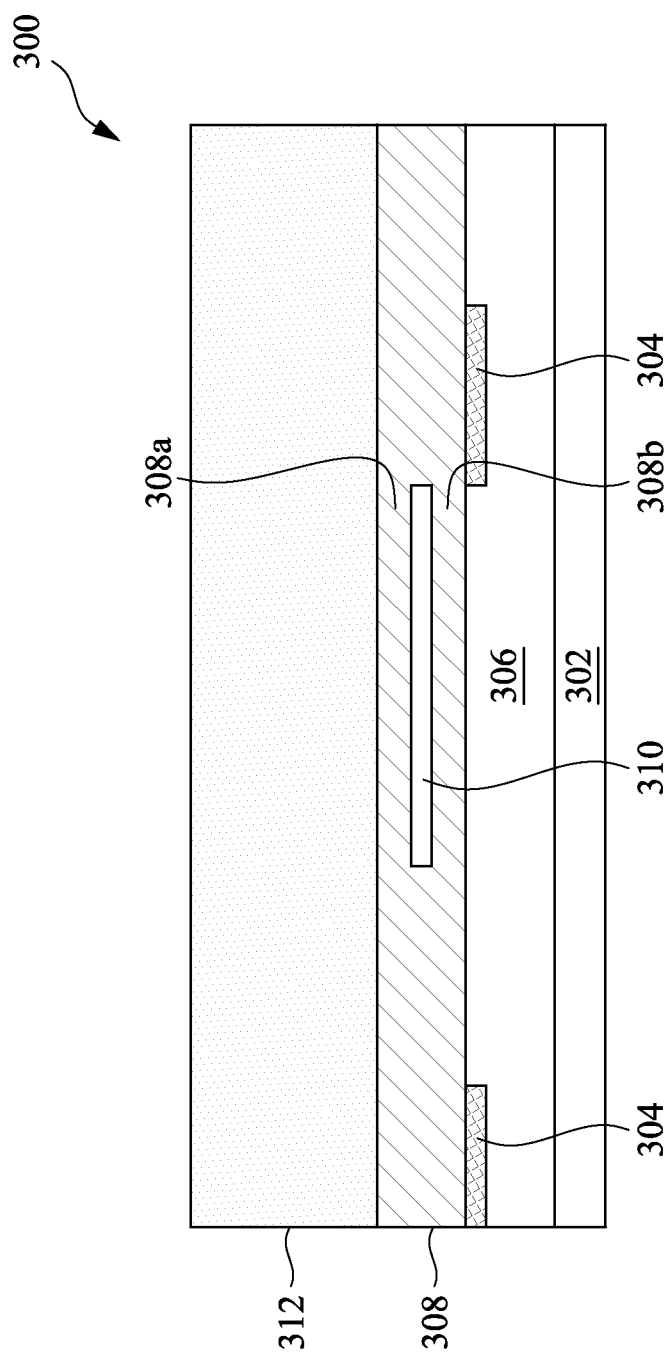
FIGS. 3-14 are cross-section views of an example semiconductor structure at various stages of fabrication, in accordance with some embodiments.
Figure 4:
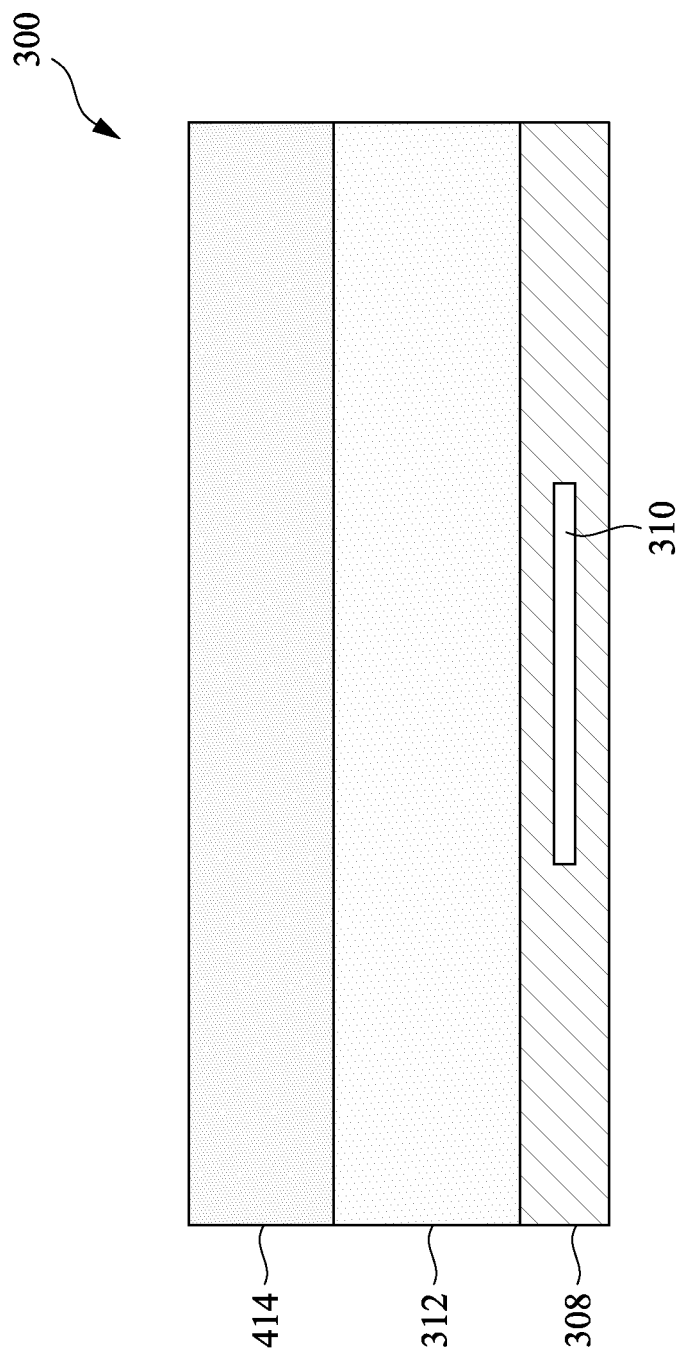
Figure 5:
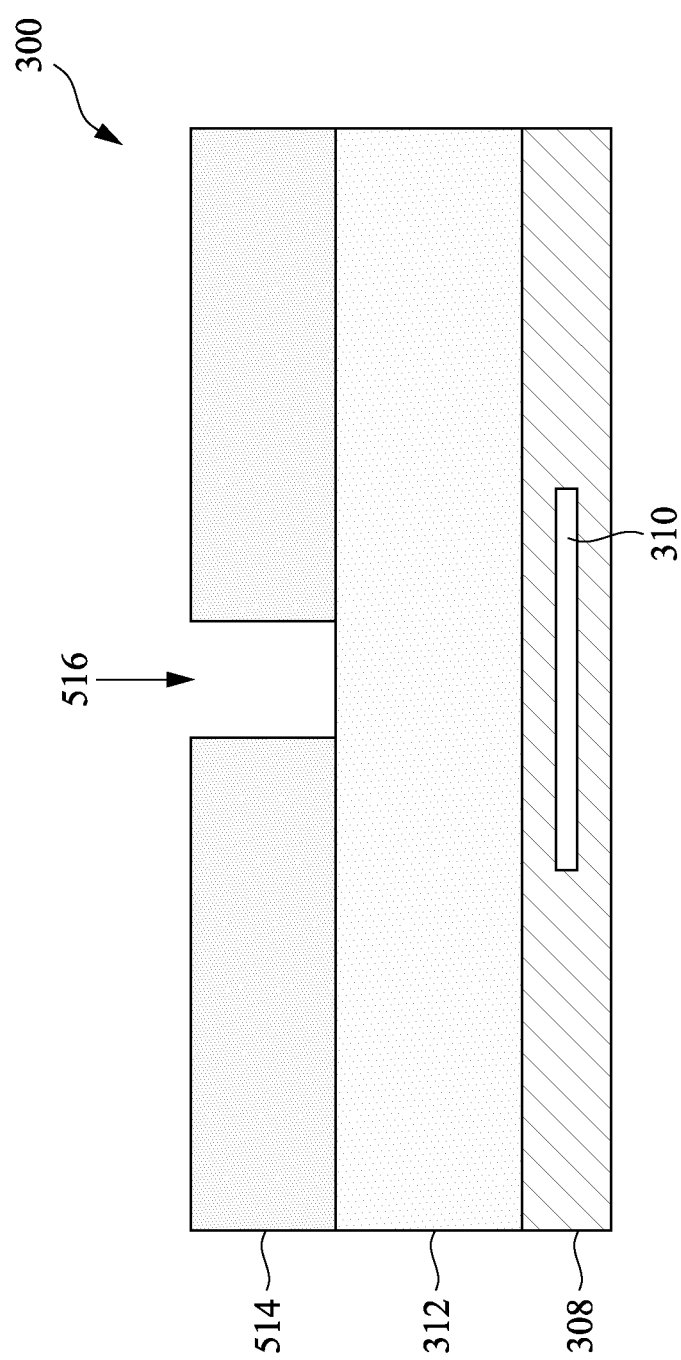
Figure 6:
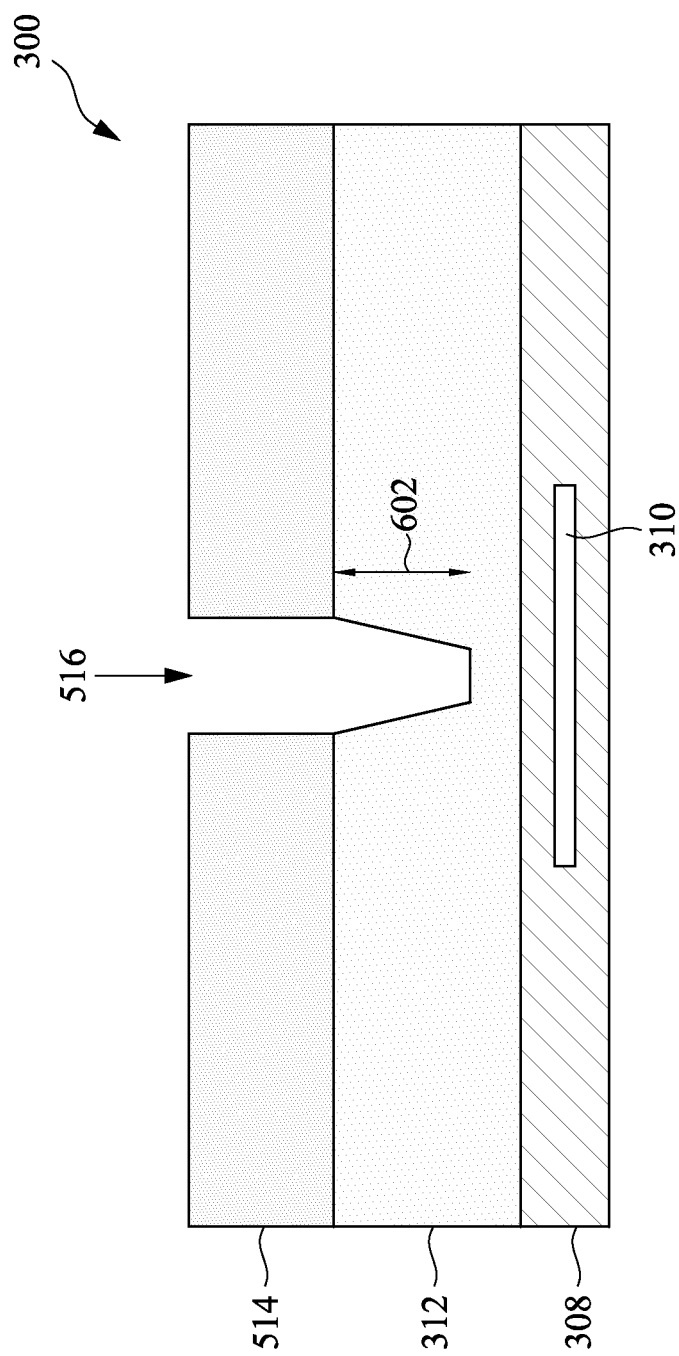

FIG. 2 is a process flow chart depicting an example method 200 of semiconductor fabrication that includes forming a convex-shaped profile on end sections on RDL structures that have a shape that resists stress migration from the RDL to a MIM capacitor to resist stress migration induced cracks from forming in or across the MIM capacitive. FIG. 2 is described in conjunction with FIGS. 3-14, which illustrate a semiconductor structure 300 at various stages of fabrication in accordance with some embodiments. The semiconductor structure 300 is analogous to the portion of semiconductor device 100 depicted in box 128 in FIG. 1. The method 200 is merely an example and is not intended to limit the present disclosure beyond what is explicitly recited in the claims. Additional steps may be provided before, during, and after method 200, and some of the steps described can be moved, replaced, or eliminated for additional embodiments of method 200. Additional features may be added in the semiconductor structure 300 depicted in the figures, and some of the features described below can be replaced, modified, or eliminated in other embodiments.

As with the other method embodiments and exemplary devices discussed herein, it is understood that parts of the semiconductor structures may be fabricated by typical semiconductor technology process flow, and thus some processes are only briefly described herein. Further, the exemplary semiconductor structures may include various other devices and features, such as other types of devices such as additional transistors, bipolar junction transistors, resistors, capacitors, inductors, dials, fuses, and/or other logic devices, etc., but is simplified for better understanding of concepts of the present disclosure.

At block 202, the example method 200 includes providing a substrate having an interconnect structure in a dielectric layer over the substrate and a first passivation layer over the dielectric layer with a MIM capacitor formed within the first passivation layer. In various embodiments, the first passivation layer has a first sublayer and a second sublayer over the first sublayer layer with the MIM capacitor formed between the first sublayer and the second sublayer.

At block 204, the example method 200 includes forming a redistribution layer (RDL) above the first passivation layer. Referring to the example of FIG. 3, in an embodiment of blocks 202 and 204, depicted is a substrate 302 having an interconnect structure 304 in a dielectric layer 306 over the substrate 302 and a first passivation layer 308 over the dielectric layer 306 with a MIM capacitor 310 formed within the first passivation layer between a first sublayer 308a and a second sublayer 308b. An RDL 312 is formed above the first passivation layer 308.

At block 206, the example method 200 includes forming a photoresist (PR) layer above the RDL. Referring to the example of FIG. 4, in an embodiment of block 206, depicted is a PR layer 414 formed over the RDL 312.

At block 208, the example method 200 includes patterning the PR layer to form a PR pattern with an opening in the PR layer above the MIM capacitor. The PR is patterned to expose select portions of the underlying RDL over the MIM capacitor to semiconductor processing, such as etching operations, while protecting covered portions of the underlying RDL from the semiconductor processing. The PR pattern may be formed by exposing and developing the PR layer by using a common method in the art. Referring to the example of FIG. 5, in an embodiment of block 208, a patterned PR layer 514 is formed over the RDL 312 with an opening 516 above the MIM capacitor 310.

At block 210, the example method 200 includes removing a portion of the RDL under the opening to a first depth. The RDL may be etched by using the patterned PR layer as an etching mask to transfer the PR pattern to the RDL. The RDL may be etched using anisotropic etching operations. Referring to the example of FIG. 6, in an embodiment of block 210, a portion of the RDL 312 under the opening 516 is removed to a first depth 602.

At block 212, the example method 200 includes removing a portion of the RDL under the opening to a second depth at the top of the first passivation layer using a trim process that forms a convex-shaped profile on sidewalls on the RDL in the opening. The trim process may involve etching the RDL using lateral etching operations to form a convex-shaped profile on sidewalls. The RDL may be etched by using isotropic etching operations to form a convex-shaped profile on sidewalls. The opening separates the RDL into a first RDL structure and a second RDL structure. The trim process may involve low pressure (e.g., 6~12 mT), low bias power (e.g., 50~200 W), lean chemistry region (e.g., $Cl_2/BCl_3$ ratio are 1:2, 1:1, 2:1, 3:1), and less byproduct (e.g., $Al_2O_3$, $CCl_4$, $CF_4$, $AlF_3$) performed in a plasma etching chamber.

Figure 7:
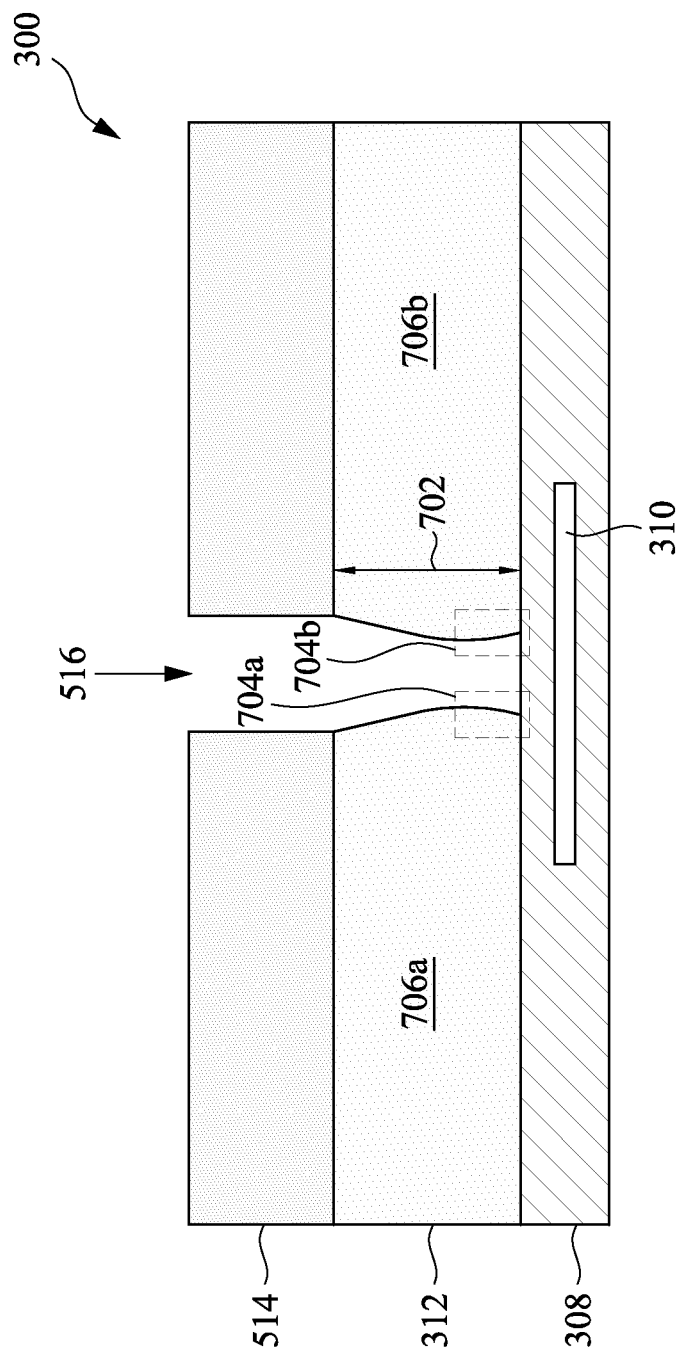
Figure 8:
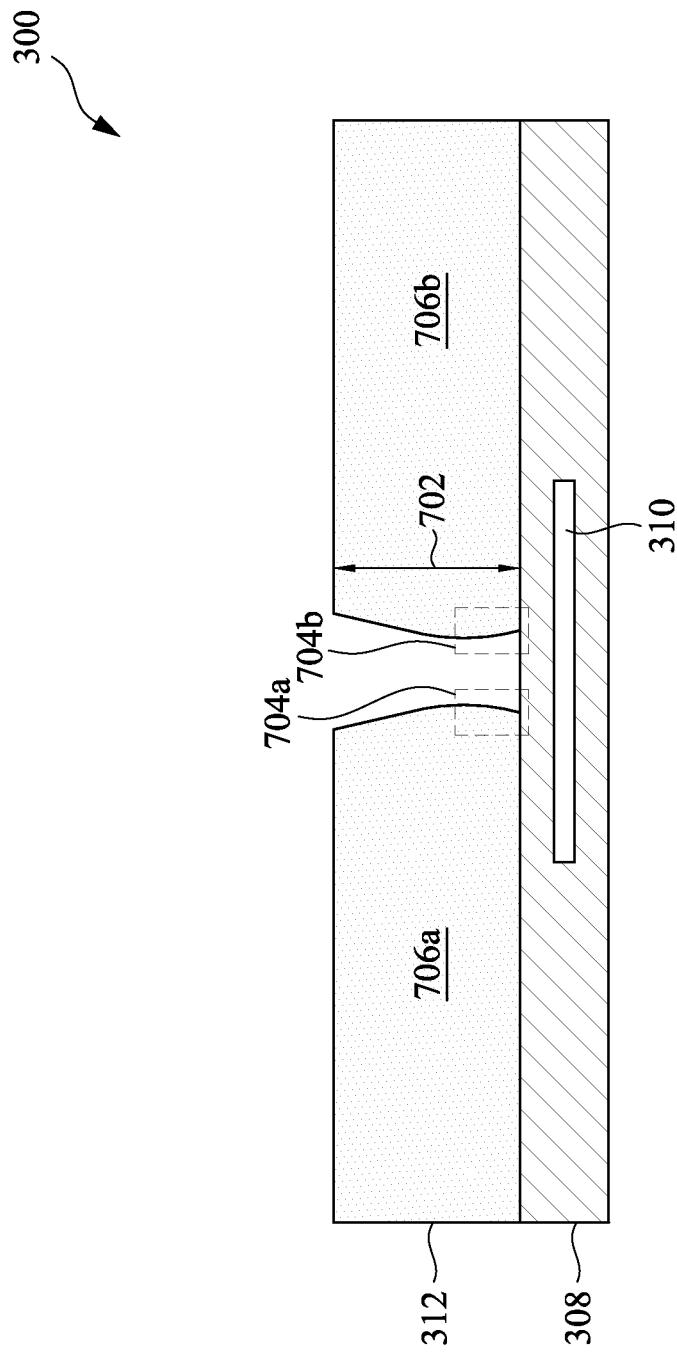

Referring to the example of FIG. 7, in an embodiment of block 212, a portion of the RDL 312 under the opening 516 is removed to a second depth 702 at the top of the first passivation layer 308 in a manner that forms a convex-shaped profile on sidewalls (illustrated in boxes 704a and 704b) on the RDL 312 in the opening 516. The opening 516 separates the RDL 312 into a first RDL structure 706a and a second RDL structure 706b.

At block 214, the example method 200 includes removing the PR layer. The PR layer may be removed using ashing operations. Referring to the example of FIG. 8, in an embodiment of block 214, the PR layer has been removed from above the RDL 312.

Figure 9:
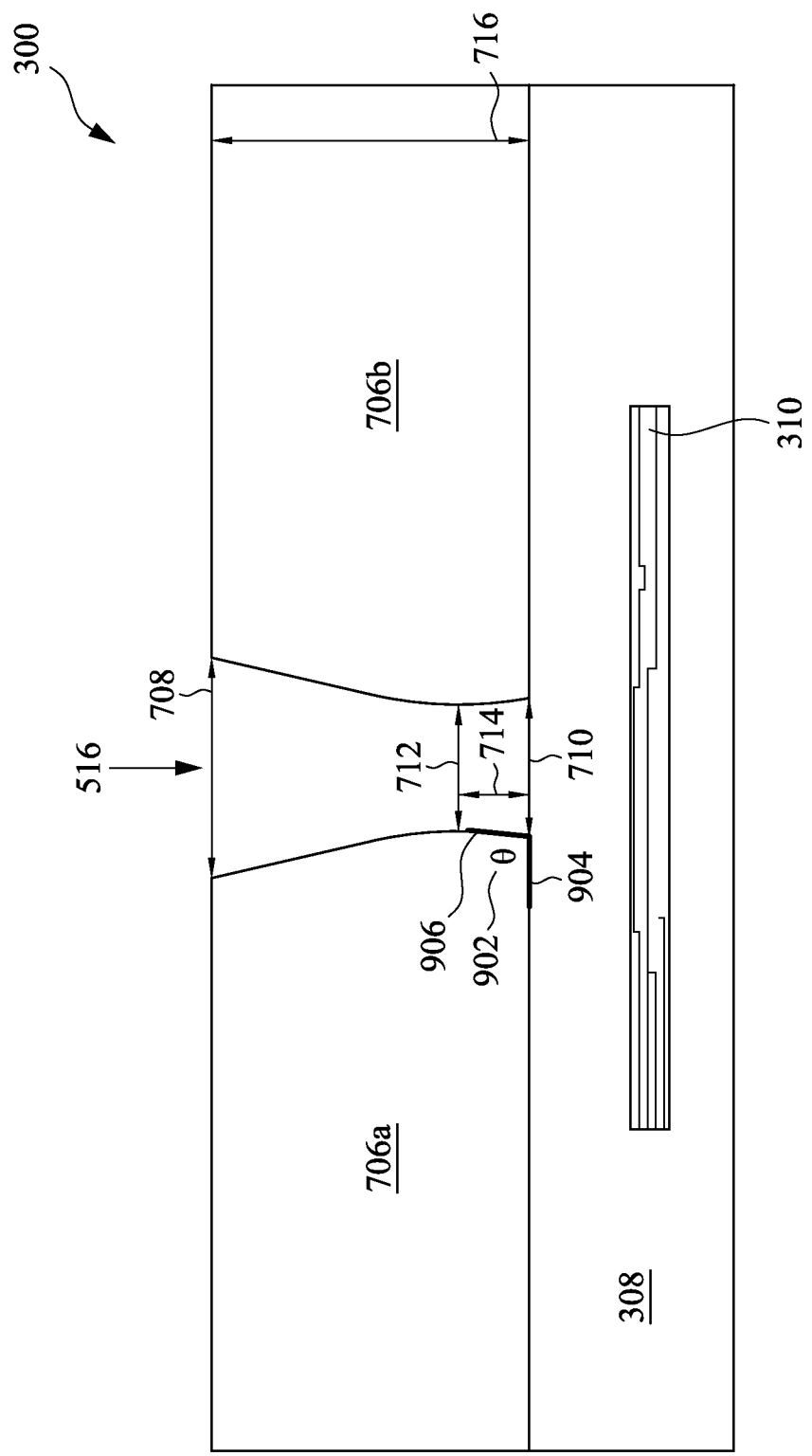
Figure 10:
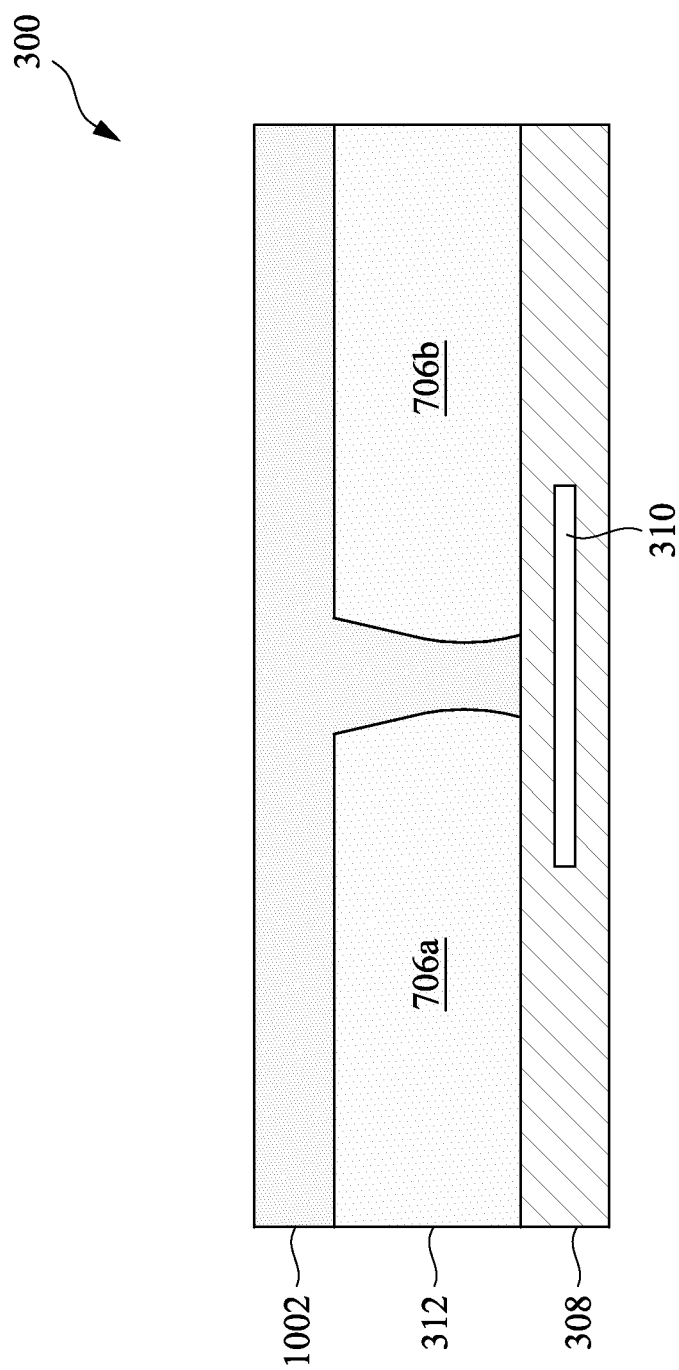
Figure 11:
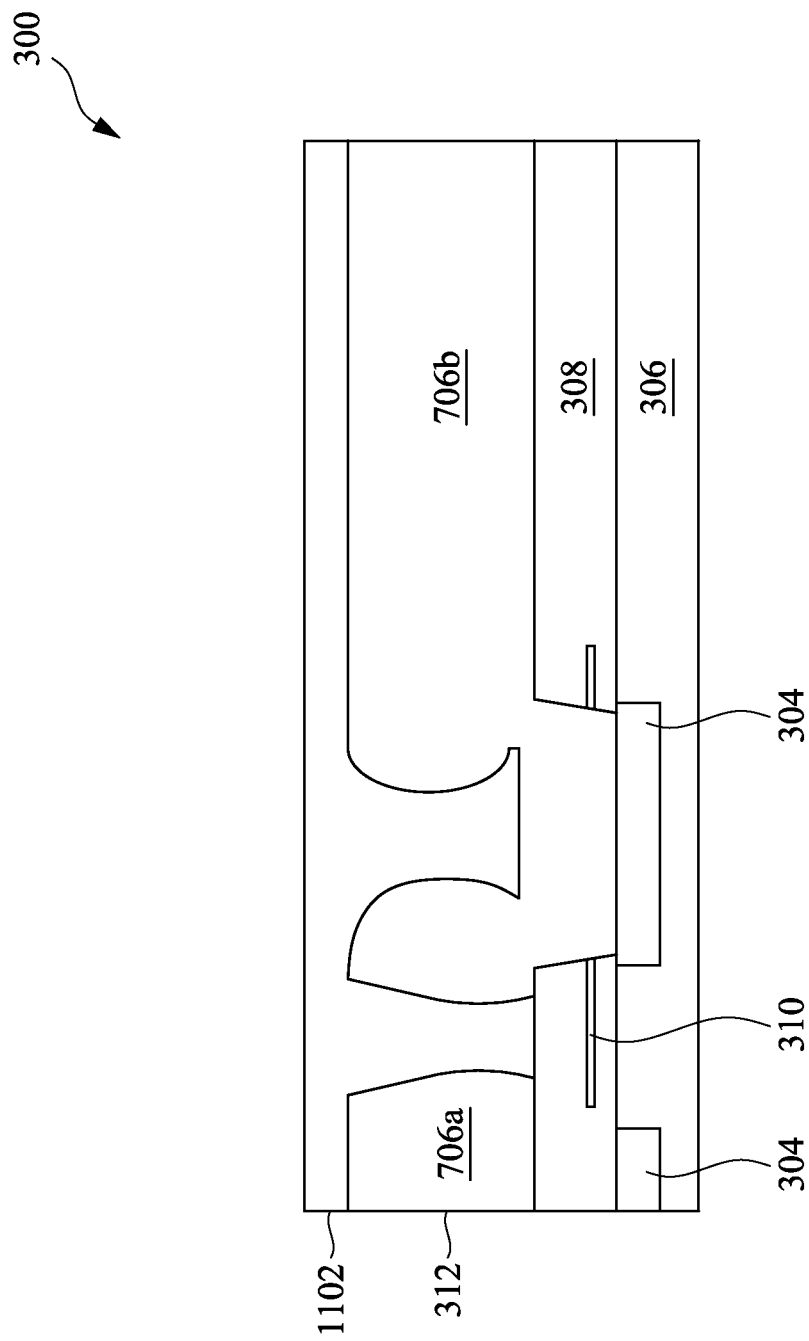
Figure 12:
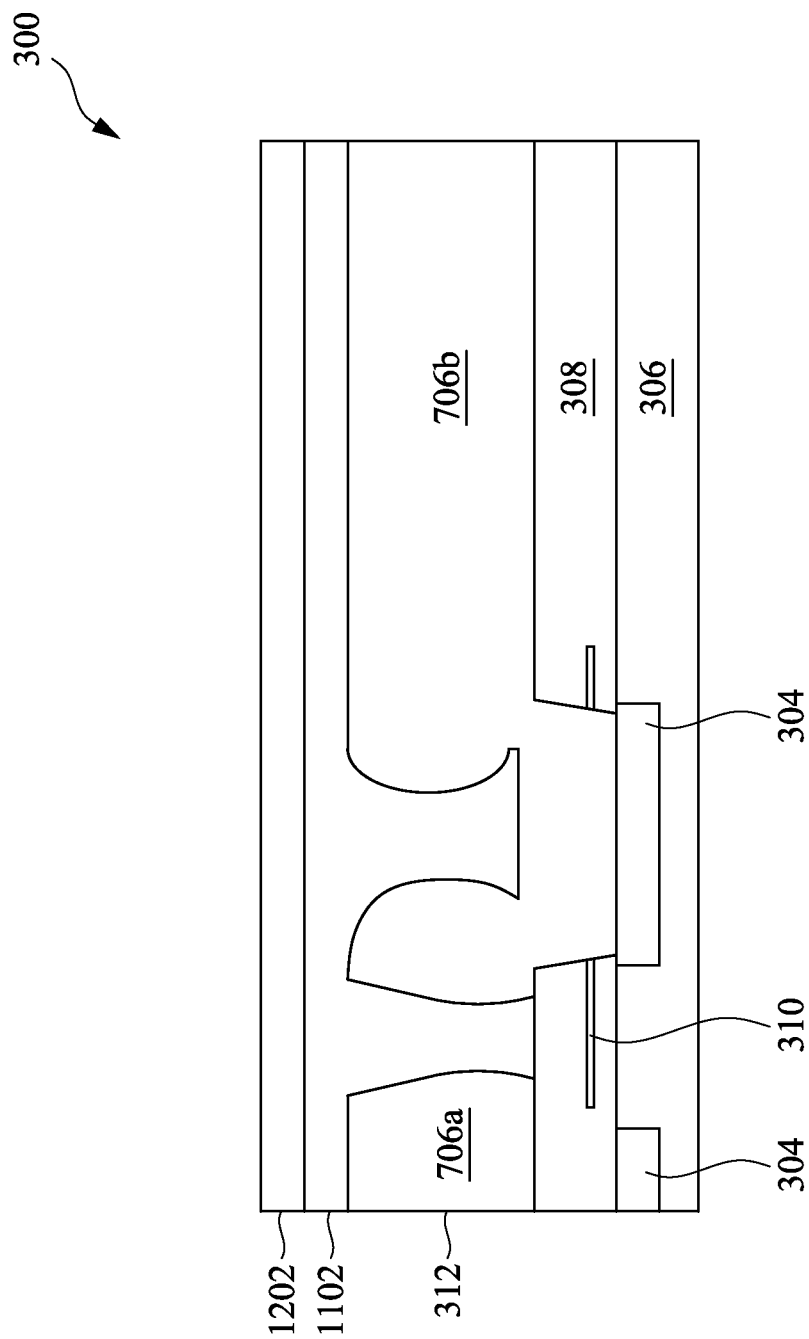
Figure 13:
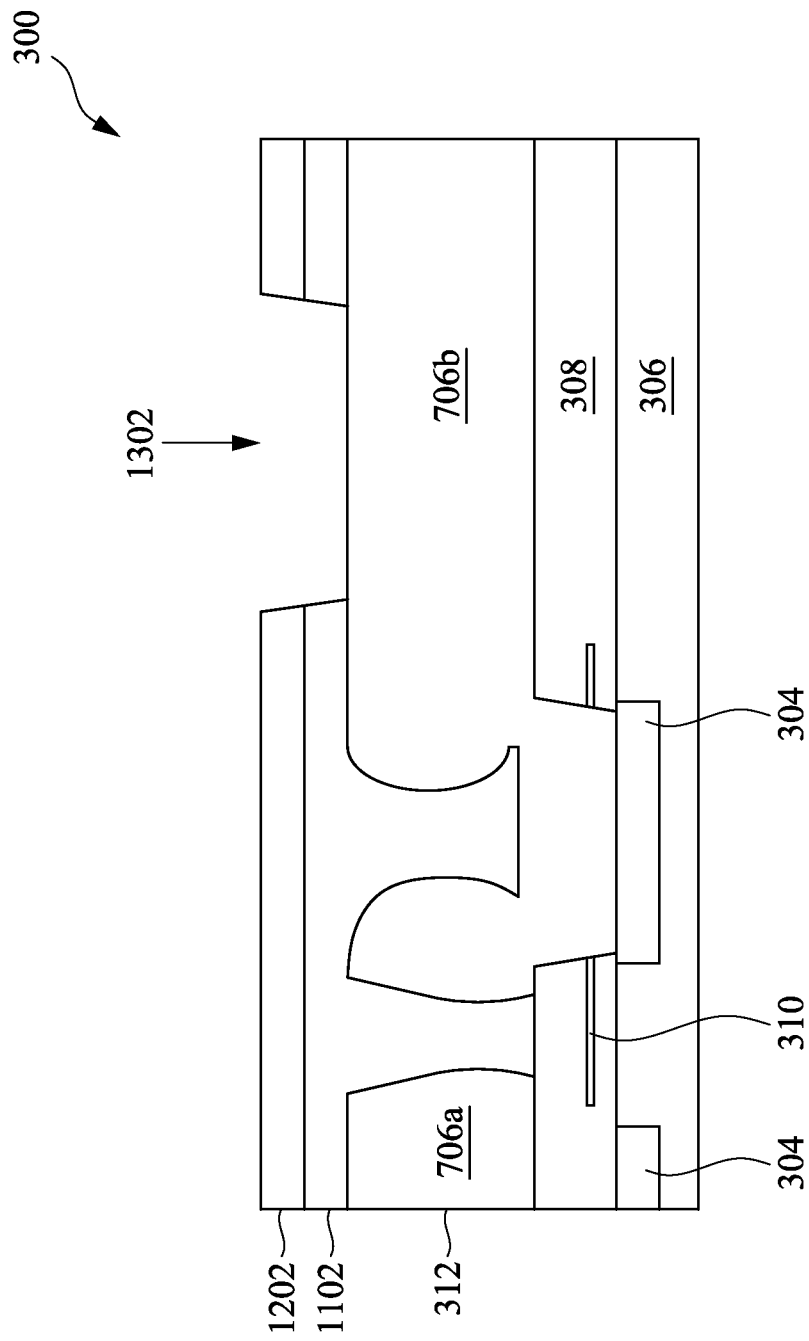

FIG. 9 is a cross-sectional view of an embodiment of a semiconductor structure that depicts example characteristics of end pieces of RDL sections after separating an RDL section into different RDL structures, in accordance with some embodiments. In various embodiments, a bottom profile angle (θ) 902 is defined between a first passivation layer-to-RDL horizontal border 904 and an upward extending edge 906 of an end section of an RDL structure (706a or 706b) is between approximately 90 degrees to approximately 120 degrees.

In various embodiments, the opening 516 between the first RDL structure 706a and the second RDL structure 706b has a top dimension 708 at the top that is between approximately 1.0 micrometer to approximately 5.0 micrometers. In various embodiments, the opening 516 between the first RDL structure 706a and the second RDL structure 706b has a bottom dimension 710 at the bottom that is between approximately 0.8 micrometer to approximately 4.0 micrometers. In various embodiments, the opening 516 between the first RDL structure 706a and the second RDL structure 706b has a minimum dimension 712 between the top and bottom of the opening 516 that is approximately 0.6 micrometer to approximately 3.6 micrometers. In various embodiments, the difference between the top dimension 708 and the minimum dimension 712 is between approximately 0.4 micrometer to approximately 1.4 micrometers. In various embodiments, the difference between the top dimension 708 and the bottom dimension 710 is between approximately 0.2 micrometer to approximately 1.0 micrometers. In various embodiments, the difference between the bottom dimension 710 and the minimum dimension 712 is between approximately 0.2 micrometer to approximately 0.4 micrometer.

In various embodiments, a barrel height 714 in the opening 516 is defined between a plane at the top of the first passivation layer 308 and a plane in which the minimum dimension 712 lies, and a ratio of barrel height 714 to RDL thickness 716 is between approximately 2% to approximately 20%. In various embodiments, the RDL 706a/706b has a thickness between approximately 2 micrometers to approximately 3 micrometers. In various embodiments, the opening 516 that separates the first RDL structure 706a from the second RDL structure 706b was formed by anisotropic vertical etching operations to a first depth followed by isotropic etching operations that included lateral etching of end sections of the first RDL structure 706a and the second RDL structure 706b below the first depth.

At block 216, the example method 200 includes forming a first dielectric layer over the RDL and in the opening between the RDL structures. The first dielectric layer may be formed by suitable deposition techniques. In various embodiments, the first dielectric layer includes USG plus a HDP layer. Referring to the example of FIGS. 10 and 11, in embodiments of block 216, a first dielectric layer (1002, 1102) has been formed over the RDL 312 and in the opening between the RDL structures 706a and 706b.

At block 218, the example method 200 includes forming a second dielectric layer over the first dielectric layer. The second dielectric layer may be formed by suitable deposition techniques. In various embodiments, the second dielectric layer includes SiN. Referring to the example of FIG. 12, in an embodiment of block 218, a second dielectric layer 1202 has been formed over the first dielectric layer 1102.

At block 220, the example method 200 includes forming a bump opening in the first dielectric layer and the second dielectric layer. The bump opening may be formed by suitable photolithography, patterning, and etching techniques. Referring to the example of FIG. 13, in an embodiment of block 220, a bump opening 1302 has been formed in the first dielectric layer 1102 and the second dielectric layer 1202.

At block 222, the example method 200 includes forming a second passivation layer over the second dielectric layer and sidewalls of the bump opening. The second passivation layer may be formed by suitable deposition techniques.

At block 224, the example method 200 includes forming a bump structure over the second passivation layer and in the bump opening. In various embodiments, the bump structure comprises a UBM layer, a conductive pillar, and a solder layer.

Figure 14:
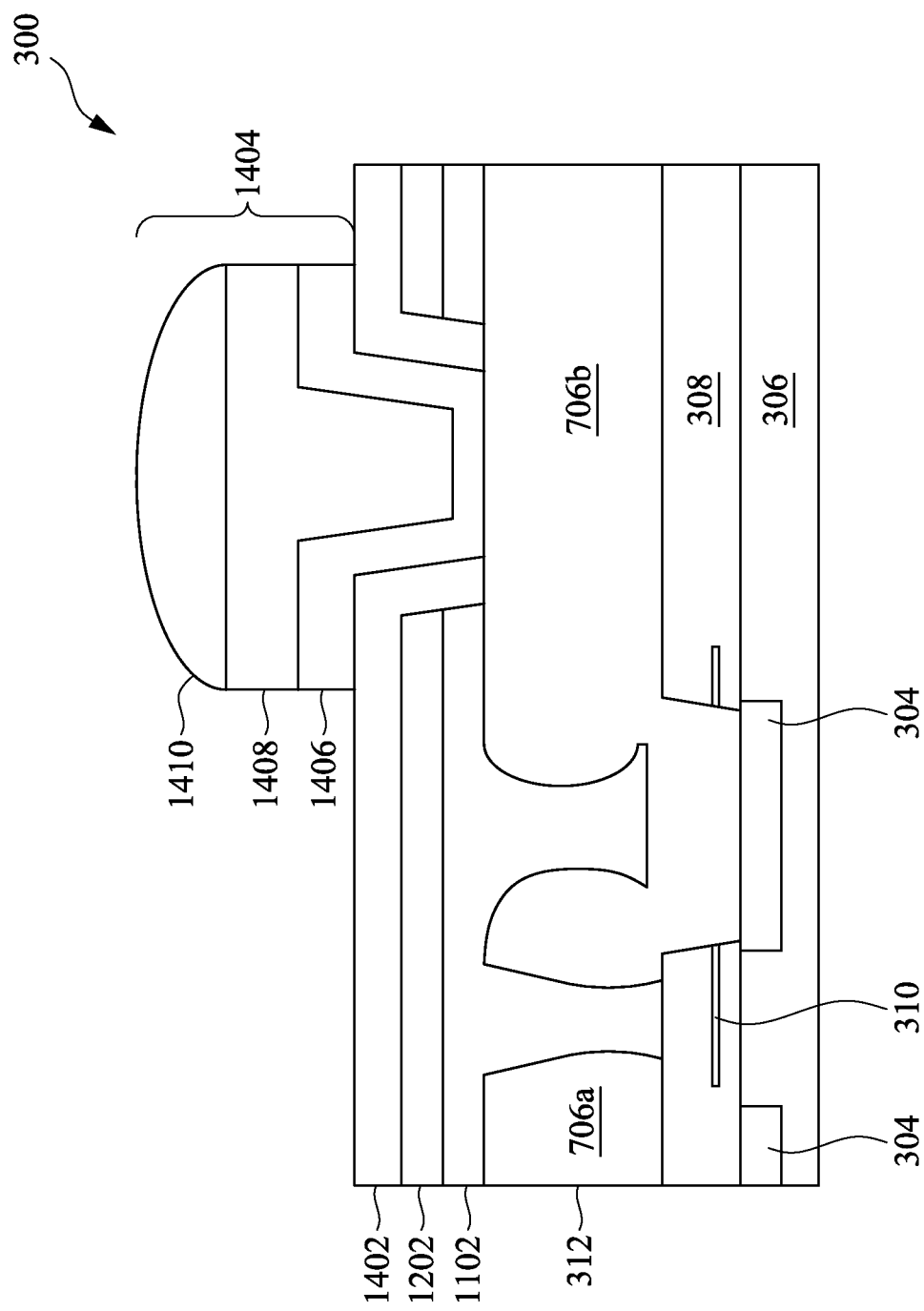

Referring to the example of FIG. 14, in an embodiment of blocks 222 and 224, a second passivation layer 1402 is formed over the second dielectric layer 1202 and sidewalls of the bump opening, and a bump structure 1404 comprising a UBM layer 1406, a conductive pillar 1408, and a solder layer 1410 is formed over the second passivation layer 1402 and in the bump opening, wherein the bump structure 1404 has an electrical connection with the second RDL structure 706b.

Herein, embodiments provide improved resistance to problems associated with stress migration (SM). SM effects may be minimized by forming a convex-shaped profile on RDL sidewalls in areas where RDL (e.g., AlCu RDL) is separated into multiple RDL structures. Further, embodiments herein may minimize crack formation due to SM on or across Metal-Insulator-Metal (MIM) capacitors positioned near sidewalls of separated RDL due to the profile of the sidewalls. The profile of the sidewalls may further improve film adhesion and provide pad well protection by preventing voids from forming due to SM.

Presented herein are embodiments of semiconductor structures and of methods for forming semiconductor structures with a sidewall profile that reduces the occurrence of problems associated with SM. In certain embodiments, SM is mitigated through the inclusion of a convex-shaped sidewall profile for RDL structures. In exemplary embodiments, the sidewall profile is formed using lateral etching operations Embodiments of the present disclosure offer advantages over the existing art, though it is understood that other embodiments may offer different advantages, not all advantages are necessarily discussed herein, and no particular advantage is required for all embodiments. For example, embodiments discussed herein include methods for forming RDL structures having a convex-shaped sidewall profile that minimizes stress migration which assists in eliminating cracks appearing in the device. Embodiments described herein provide a simplified film scheme and etching process without extra masks. Embodiments described herein are suitable for integration with next packaging layers.

Thus, one of the embodiments of the present disclosure describes a device including a first passivation layer over a substrate with a metal-insulator-metal (MIM) capacitor embedded in the first passivation layer, a redistribution layer (RDL) formed above the first passivation layer wherein the RDL includes a first RDL structure and a second RDL structure, wherein the first RDL structure is separated from the second RDL structure through a dielectric-filled opening, and wherein the dielectric-filled opening is above a portion of the MIM capacitor. Each of the first RDL structure and the second RDL structure has a convex-shaped profile on a sidewall that defines the dielectric-filled opening that separates the first RDL structure from the second RDL structure, wherein the convex-shaped profile on the sidewalls resist stress migration from the RDL to the MIM capacitor to resist stress migration induced cracks forming in the MIM capacitor.

In certain embodiments of the device, a bottom profile angle defined between a first passivation layer-to-RDL horizontal border and an upward extending edge of an end section of an RDL structure is between approximately 90 degrees to approximately 120 degrees.

In certain embodiments of the device, the dielectric-filled opening has: a top dimension at the top that is between approximately 1.0 micrometer to approximately 5.0 micrometers; a bottom dimension at the bottom that is between approximately 0.8 micrometer to approximately 4.0 micrometers; and a minimum dimension between the top and bottom of the dielectric-filled opening that is approximately 0.6 micrometer to approximately 3.6 micrometers.

In certain embodiments of the device, the difference between the top dimension and the minimum dimension is between approximately 0.4 micrometer to approximately 1.4 micrometers; the difference between the top dimension and the bottom dimension is between approximately 0.2 micrometer to approximately 1.0 micrometers; and the difference between the bottom dimension and the minimum dimension is between approximately 0.2 micrometer to approximately 0.4 micrometer;

In certain embodiments of the device, a barrel height in the dielectric-filled opening is defined between a plane at the top of the first passivation layer and a plane in which the minimum dimension lies; and a ratio of barrel height to RDL thickness is between approximately 2% to approximately 20%.

In certain embodiments of the device, the RDL has a thickness between approximately 2 micrometers to approximately 3 micrometers.

In certain embodiments of the device, the dielectric-filled opening that separates the first RDL structure from the second RDL structure was formed by anisotropic vertical etching operations to a first depth followed by isotropic etching operations that included lateral etching of end sections of the first RDL structure and the second RDL structure below the first depth.

Another embodiment of the present disclosure describes a method that includes: providing a first passivation layer over a substrate with a metal-insulator-metal (MIM) capacitor embedded in the first passivation layer; forming a redistribution layer (RDL) above the first passivation layer; and forming an opening in the RDL above a portion of the MIM capacitor, wherein the opening separates the RDL into a first RDL structure and a second RDL structure, wherein each of the first RDL structure and the second RDL structure has a convex-shaped profile on a sidewall that defines the opening that separates the first RDL structure from the second RDL structure, and wherein the convex-shaped profile on the sidewalls resists stress migration from the RDL to the MIM capacitor to resist stress migration induced cracks forming in the MIM capacitor. The forming an opening includes: removing a portion of the RDL above the portion of the MIM capacitor to a first depth using first etching operations; and removing a portion of the RDL above the portion of the MIM capacitor to a second depth to the top of the passivation layer by performing second etching operations that include lateral etching of sidewalls of the first RDL structure and the second RDL structure below the first depth to the second depth, wherein the lateral etching forms the convex-shaped profile on the sidewalls.

In certain embodiments of the method, the first etching operations include anisotropic vertical etching operations and the second etching operations include isotropic etching operations.

In certain embodiments of the method, forming a convex-shaped profile includes forming a bottom profile angle defined between a first passivation layer-to-RDL horizontal border and an upward extending edge of an end section of an RDL structure that is between approximately 90 degrees to approximately 120 degrees.

In certain embodiments of the method, forming an opening in the RDL above a portion of the MIM capacitor includes forming an opening that has: a top dimension at the top that is between approximately 1.0 micrometer to approximately 5.0 micrometers; a bottom dimension at the bottom that is between approximately 0.8 micrometer to approximately 4.0 micrometers; and a minimum dimension between the top and bottom of the dielectric-filled opening that is approximately 0.6 micrometer to approximately 3.6 micrometers.

In certain embodiments of the method, the difference between the top dimension and the minimum dimension is between approximately 0.4 micrometer to approximately 1.4 micrometers; the difference between the top dimension and the bottom dimension is between approximately 0.2 micrometer to approximately 1.0 micrometers; and the difference between the bottom dimension and the minimum dimension is between approximately 0.2 micrometer to approximately 0.4 micrometer.

In certain embodiments of the method, a barrel height in the opening is defined between a plane at the top of the first passivation layer and a plane in which the minimum dimension lies; and a ratio of barrel height to RDL thickness is between approximately 2% to approximately 20%.

In certain embodiments of the method, forming a RDL above the first passivation layer includes forming a RDL that has a thickness between approximately 2 micrometers to approximately 3 micrometers.

Another embodiment of the present disclosure describes a method that includes: providing a substrate having an interconnect structure in a dielectric layer over the substrate and having a first passivation layer over the dielectric layer, the first passivation layer having a first sublayer, a second sublayer over the first sublayer layer, and a metal-insulator-metal (MIM) capacitor formed between the first sublayer and the second sublayer; forming a redistribution layer (RDL) above the first passivation layer and in an opening in the passivation layer above a top metal structure in the interconnect structure to connect to the top metal structure; and forming an opening in the RDL above a portion of the MIM capacitor, wherein the opening separates the RDL into a first RDL structure that is not connected to the top metal structure and a second RDL structure that includes the RDL that connects to the top metal structure, wherein each of the first RDL structure and the second RDL structure has a convex-shaped profile on a sidewall that defines the opening that separates the first RDL structure from the second RDL structure, and wherein the convex-shaped profile on the sidewalls resists stress migration from the RDL to the MIM capacitor to resist stress migration induced cracks forming in the MIM capacitive structure. The forming an opening includes: forming a patterned photoresist (PR) layer that defines an opening above the portion of the MIM capacitor; removing a portion of the RDL under the opening in the PR layer to a first depth using first etching operations; removing a portion of the RDL under the opening in the PR layer to a second depth at the top of the first passivation layer by performing second etching operations that include lateral etching of sidewalls of the first RDL structure and the second RDL structure below the first depth to the second depth, the lateral etching forming the convex-shaped profile on the sidewalls; and removing the patterned PR layer.

In certain embodiments of the method, the first etching operations include anisotropic vertical etching operations and the second etching operations include isotropic etching operations.

In certain embodiments, the method further includes forming a first dielectric layer over the RDL; forming a second dielectric layer over the first dielectric layer; forming a bump opening in the first dielectric layer and the second dielectric layer over the first RDL structure; forming a second passivation layer over the second dielectric layer and sidewalls of the bump opening; and forming a conductive pillar over the second passivation layer and the bump opening.

In certain embodiments of the method, the conductive pillar includes an under bump metallurgy (UBM) layer, a copper (Cu) bump structure, and a solder layer In certain embodiments of the method, forming a convex-shaped profile includes forming a bottom profile angle defined between a first passivation layer-to-RDL horizontal border and an upward extending edge of an end section of an RDL structure that is between approximately 90 degrees to approximately 120 degrees.

In certain embodiments of the method, forming an opening in the RDL above a portion of the MIM capacitor includes forming an opening that has: a top dimension at the top that is between approximately 1.0 micrometer to approximately 5.0 micrometers; a bottom dimension at the bottom that is between approximately 0.8 micrometer to approximately 4.0 micrometers; and a minimum dimension between the top and bottom of the dielectric-filled opening that is approximately 0.6 micrometer to approximately 3.6 micrometers.

In certain embodiments of the method, the difference between the top dimension and the minimum dimension is between approximately 0.4 micrometer to approximately 1.4 micrometers; the difference between the top dimension and the bottom dimension is between approximately 0.2 micrometer to approximately 1.0 micrometers; and the difference between the bottom dimension and the minimum dimension is between approximately 0.2 micrometer to approximately 0.4 micrometer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
providing a first passivation layer over a substrate with a metal-insulator-metal (MIM) capacitor embedded in the first passivation layer;
forming a redistribution layer (RDL) above the first passivation layer; and
forming an opening in the RDL above a portion of the MIM capacitor, wherein the opening separates the RDL into a first RDL structure and a second RDL structure, wherein each of the first RDL structure and the second RDL structure has a convex-shaped profile on a sidewall that defines the opening that separates the first RDL structure from the second RDL structure, forming the opening comprising:
removing a portion of the RDL above the portion of the MIM capacitor to a first depth using first etching operations; and
removing a portion of the RDL above the portion of the MIM capacitor to a second depth to a top level of the first passivation layer by performing second etching operations that include lateral etching of sidewalls of the first RDL structure and the second RDL structure below the first depth to the second depth, wherein the lateral etching forms the convex-shaped profile on the sidewalls.

2. The method of claim 1, wherein the first etching operations comprise anisotropic vertical etching operations and the second etching operations comprise isotropic etching operations.

3. The method of claim 1, wherein forming a convex-shaped profile comprises forming a bottom profile angle defined between a first passivation layer-to-RDL horizontal border and an upward extending edge of an end section of an RDL structure that is between approximately 90 degrees to approximately 120 degrees.

4. The method of claim 1, wherein forming an opening in the RDL above a portion of the MIM capacitor comprises forming an opening that has:
a top dimension at a top of the opening that is between approximately 1.0 micrometer to approximately 5.0 micrometers;
a bottom dimension at a bottom of the opening that is between approximately 0.8 micrometer to approximately 4.0 micrometers; and
a minimum dimension between the top of the opening and bottom of the opening that is approximately 0.6 micrometer to approximately 3.6 micrometers.

5. The method of claim 4, wherein:
a difference between the top dimension and the minimum dimension is between approximately 0.4 micrometer to approximately 1.4 micrometers;
a difference between the top dimension and the bottom dimension is between approximately 0.2 micrometer to approximately 1.0 micrometers; and
a difference between the bottom dimension and the minimum dimension is between approximately 0.2 micrometer to approximately 0.4 micrometer.

6. The method of claim 4, wherein:
a barrel height in the opening is defined between a plane at a top level of the first passivation layer and a plane in which the minimum dimension lies; and
a ratio of barrel height to RDL thickness is between approximately 2% to approximately 20%.

7. The method of claim 1, wherein forming a RDL above the first passivation layer comprises forming a RDL that has a thickness between approximately 2 micrometers to approximately 3 micrometers.

8. A method comprising:
providing a substrate having an interconnect structure in a dielectric layer over the substrate and having a first passivation layer over the dielectric layer, the first passivation layer having a first sublayer, a second sublayer over the first sublayer, and a metal-insulator-metal (MIM) capacitor formed between the first sublayer and the second sublayer;
forming a redistribution layer (RDL) above the first passivation layer and in an opening in the first passivation layer above a top metal structure in the interconnect structure to connect to the top metal structure; and
forming an opening in the RDL above a portion of the MIM capacitor, wherein the opening separates the RDL into a first RDL structure that is not connected to the top metal structure and a second RDL structure that includes the RDL that connects to the top metal structure, wherein each of the first RDL structure and the second RDL structure has a convex-shaped profile on a sidewall that defines the opening that separates the first RDL structure from the second RDL structure, wherein forming the opening comprises:
forming a patterned photoresist (PR) layer that defines an opening above the portion of the MIM capacitor;
removing a portion of the RDL under the opening in the patterned PR layer to a first depth using first etching operations;
removing a portion of the RDL under the opening in the patterned PR layer to a second depth at a top of the first passivation layer by performing second etching operations that include lateral etching of sidewalls of the first RDL structure and the second RDL structure below the first depth to the second depth, the lateral etching forming the convex-shaped profile on the sidewalls; and
removing the patterned PR layer.

9. The method of claim 8, further comprising:
forming a first dielectric layer over the RDL;
forming a second dielectric layer over the first dielectric layer;
forming a bump opening in the first dielectric layer and the second dielectric layer over the first RDL structure;
forming a second passivation layer over the second dielectric layer and sidewalls of the bump opening; and
forming a conductive pillar over the second passivation layer and the bump opening.

10. The method of claim 9, wherein the conductive pillar comprises an under bump metallurgy (UBM) layer, a copper (Cu) bump structure, and a solder layer.

11. The method of claim 8, wherein forming a convex-shaped profile comprises forming a bottom profile angle defined between a first passivation layer-to-RDL horizontal border and an upward extending edge of an end section of an RDL structure that is between approximately 90 degrees to approximately 120 degrees.

12. The method of claim 8, wherein forming an opening in the RDL above a portion of the MIM capacitor comprises forming an opening that has:
a top dimension at a top of the opening that is between approximately 1.0 micrometer to approximately 5.0 micrometers;

a bottom dimension at a bottom of the opening that is between approximately 0.8 micrometer to approximately 4.0 micrometers; and a minimum dimension between the top of the opening and bottom of the opening that is approximately 0.6 micrometer to approximately 3.6 micrometers.

13. The method of claim 12, wherein:

a difference between the top dimension and the minimum dimension is between approximately 0.4 micrometer to approximately 1.4 micrometers;

a difference between the top dimension and the bottom dimension is between approximately 0.2 micrometer to approximately 1.0 micrometers; and a difference between the bottom dimension and the minimum dimension is between approximately 0.2 micrometer to approximately 0.4 micrometer.

14. A method comprising:

providing a substrate having an interconnect structure in a dielectric layer over the substrate and having a first passivation layer over the dielectric layer, the first passivation layer having a first sublayer, a second sublayer over the first sublayer, and a metal-insulator-metal (MIM) capacitor formed between the first sublayer and the second sublayer;

forming a redistribution layer (RDL) above the first passivation layer;

forming an opening in the RDL above a portion of the MIM capacitor, wherein the opening separates the RDL into a first RDL structure and a second RDL structure, wherein each of the first RDL structure and the second RDL structure has a convex-shaped profile on a sidewall that defines the opening that separates the first RDL structure from the second RDL structure, wherein forming the opening comprises:

vertical etching a portion of the RDL above the portion of the MIM capacitor to a first depth using anisotropic vertical etching operations; and laterally etching sidewalls of the first RDL structure and the second RDL structure below the first depth to a second depth at a top level of the first passivation layer thereby forming the convex-shaped profile on the sidewalls; and filling the opening between the first RDL structure and the second RDL structure with a second dielectric layer.

15. The method of claim 14, wherein the convex-shaped profile includes a bottom profile angle defined between a first passivation layer-to-RDL horizontal border and an upward extending edge of an end section of an RDL structure that is between approximately 90 degrees to approximately 120 degrees.

16. The method of claim 14, wherein the opening has:

a top dimension at a top of the opening that is between approximately 1.0 micrometer to approximately 5.0 micrometers;

a bottom dimension at a bottom of the opening that is between approximately 0.8 micrometer to approximately 4.0 micrometers; and a minimum dimension between the top of the opening and the bottom of the opening that is approximately 0.6 micrometer to approximately 3.6 micrometers.

17. The method of claim 16, wherein:

a difference between the top dimension and the minimum dimension is between approximately 0.4 micrometer to approximately 1.4 micrometers;

a difference between the top dimension and the bottom dimension is between approximately 0.2 micrometer to approximately 1.0 micrometers; and a difference between the bottom dimension and the minimum dimension is between approximately 0.2 micrometer to approximately 0.4 micrometer.

18. The method of claim 16, wherein:

a barrel height in the opening is defined between a plane at the top of the first passivation layer and a plane in which the minimum dimension lies; and a ratio of barrel height to RDL thickness is between approximately 2% to approximately 20%.

19. The method of claim 14, wherein the RDL has a thickness between approximately 2 micrometers to approximately 3 micrometers.

20. The method of claim 14, wherein filling the opening between the first RDL structure and the second RDL structure with the second dielectric layer comprises forming the second dielectric layer over the RDL, and further comprising:

forming a third dielectric layer over the second dielectric layer;

forming a bump opening in the second dielectric layer and the third dielectric layer over the first RDL structure;

forming a second passivation layer over the third dielectric layer and sidewalls of the bump opening; and forming a conductive pillar over the second passivation layer and the bump opening.

* * * * *